United States Patent
Chen

(10) Patent No.: US 8,084,894 B2
(45) Date of Patent: Dec. 27, 2011

(54) SOLID STATE RELAY

(75) Inventor: Baoxing Chen, Westford, MA (US)

(73) Assignee: Analog Devices, Inc., Norwood, MA (US)

( * ) Notice: Subject to any disclaimer, the term of this patent is extended or adjusted under 35 U.S.C. 154(b) by 324 days.

(21) Appl. No.: 12/012,708

(22) Filed: Feb. 4, 2008

(65) Prior Publication Data

US 2009/0195082 A1   Aug. 6, 2009

(51) Int. Cl.
*H01H 9/54* (2006.01)

(52) U.S. Cl. ....................................... 307/140

(58) Field of Classification Search ............... 307/139, 307/140, 113; 327/419, 423, 424, 434, 465, 327/343; 331/167, 117 FE
See application file for complete search history.

(56) References Cited

U.S. PATENT DOCUMENTS

| | | | |
|---|---|---|---|
| 4,024,452 A | 5/1977 | Seidel | |
| 4,554,462 A * | 11/1985 | Komiya et al. | 307/140 |
| 4,564,768 A * | 1/1986 | Komiya et al. | 307/140 |
| 4,785,345 A | 11/1988 | Rawls et al. | |
| 5,469,098 A | 11/1995 | Johnson, Jr. | |
| 5,650,357 A | 7/1997 | Dobkin et al. | |
| 5,701,037 A | 12/1997 | Weber et al. | |
| 5,781,077 A | 7/1998 | Leitch et al. | |
| 5,900,764 A * | 5/1999 | Imam et al. | 327/343 |
| 7,075,329 B2 | 7/2006 | Chen et al. | |
| 7,489,526 B2 * | 2/2009 | Chen et al. | 363/17 |
| 7,545,059 B2 | 6/2009 | Chen et al. | |
| 7,548,440 B2 * | 6/2009 | Chen et al. | 363/98 |
| 7,613,016 B2 * | 11/2009 | Chen et al. | 363/17 |
| 7,683,654 B2 | 3/2010 | Chen et al. | |
| 7,706,154 B2 | 4/2010 | Chen et al. | |
| 7,719,305 B2 | 5/2010 | Chen | |
| 2003/0075990 A1 * | 4/2003 | Guitton et al. | 307/139 |
| 2005/0288739 A1 * | 12/2005 | Hassler et al. | 607/61 |
| 2006/0039169 A1 * | 2/2006 | Chen et al. | 363/17 |
| 2006/0120115 A1 * | 6/2006 | Chen et al. | 363/17 |
| 2007/0052399 A1 * | 3/2007 | Chen et al. | 323/282 |
| 2007/0052514 A1 * | 3/2007 | Chen et al. | 336/222 |
| 2007/0133144 A1 * | 6/2007 | Lewis | 361/160 |
| 2008/0094046 A1 * | 4/2008 | Chen et al. | 323/282 |
| 2009/0184754 A1 | 7/2009 | Chen | |
| 2009/0195082 A1 * | 8/2009 | Chen | 307/125 |

FOREIGN PATENT DOCUMENTS

WO   WO 99/21332   4/1999

OTHER PUBLICATIONS

G. Knoedl, Jr., et al., "A Monolithic Signal Isolator", IEEE, 1989, pp. 165-170.

* cited by examiner

*Primary Examiner* — Jared Fureman
*Assistant Examiner* — Daniel Cavallari
(74) *Attorney, Agent, or Firm* — Kenyon & Kenyon LLP

(57) ABSTRACT

A solid state relay includes: an oscillator circuit responsive to a control signal for generating an a.c. signal; an isolation transformer having a primary winding which forms a part of the tank circuit of the oscillator circuit and a secondary winding; a rectifier responsive to the a.c. signal from the oscillator circuit for providing a d.c. drive signal; and a switch circuit responsive to the drive signal to open and close the relay.

23 Claims, 4 Drawing Sheets

SOLID STATE RELAY

FIELD OF THE INVENTION

This invention relates to an improved solid state relay and more particularly to such a relay which uses an isolation transformer which may be a micro-transformer and which relay may be contained on an integrated circuit chip.

BACKGROUND OF THE INVENTION

Solid state relays generally employ an isolation device between the input device or control signal and the relay. One type of isolator is an opto-isolator which uses a light source and a photodiode to isolate the control circuit from the relay. These have a number of shortcomings. They are slow and they are difficult to integrate with the solid state relay switch devices in the fabrication process for integrated circuit chips. Further multi-channel designs introduce a cross talk problem between the light emitters and detectors. Another type of isolator is a transformer isolator that passes the control signal from the primary to the secondary and uses a trigger circuit to respond to a feature e.g. a rising edge of the a.c. signal from the secondary to generate a current to operate a triac switch constituting the relay. One problem with this is that a triac is generally implemented as a discrete element because it is difficult to fabricate in an integrated circuit chip process e.g. CMOS. Further a triac requires a high trigger current e.g. 30-50 ma which requires a larger transformer not readily implementable in an integrated circuit chip process. In addition these transformers tend to be slow: not able to switch on and off quickly because of their size and higher inductance. Further, when a triac is working to an inductive load, a snubber circuit must be used to address the turn off delay caused by the induced current through the triac from the collapsing field. Triacs also have a relatively high forward resistance which makes them less than ideal for low voltage, high current loads.

SUMMARY OF THE INVENTION

It is therefore an object of this invention to provide an improved solid state relay.

It is a further object of this invention to provide such an improved solid state relay with transformer isolation.

It is a further object of this invention to provide such an improved solid state relay which can be entirely contained on an integrated circuit chip.

It is a further object of this invention to provide such an improved solid state relay which can be entirely contained on a CMOS integrated circuit chip.

It is a further object of this invention to provide such an improved solid state relay which can operate a very high bandwidths and the relay can be turned on and off very quickly.

It is a further object of this invention to provide such an improved solid state relay which is amenable to multi-channel applications.

The invention results from the realization that an improved, faster, solid state relay with transformer isolation can be achieved by incorporating the primary of the isolation transformer in the tank circuit of an oscillator which is turned on by a control signal, then rectifying the oscillator output to recover the control signal to operate a relay switch circuit, and further that the isolation transformer can be a micro-transformer and the whole relay, oscillator, transformer, rectifier and relay switch circuit can be implemented in an integrated circuit CMOS chip.

The subject invention, however, in other embodiments, need not achieve all these objectives and the claims hereof should not be limited to structures or methods capable of achieving these objectives.

This invention features a solid state relay including an oscillator circuit responsive to a control signal for generating an a.c. signal; an isolation transformer having a primary winding which forms a part of the tank circuit of the oscillator circuit and a secondary winding. A rectifier responsive to the a.c. signal from the oscillator circuit provides a d.c. drive signal. A switch circuit responsive to the drive signal opens and closes the relay.

In a preferred embodiment the oscillator circuit may include a cross-coupled, bi-stable oscillator. The oscillator circuit may include a dual, cross-coupled, bi-stable oscillator. The parasitic capacitance of the oscillator circuit may form a part of the tank circuit. The rectifier may be a full wave rectifier. The switch circuit may be a bi-directional switch. The single wave cross coupled bi stable oscillator may include a pair of MOSFET oscillator switches. The pair of MOSFET oscillator switches may be NMOS transistors. The dual, cross coupled, bistable oscillator may include a pair of PMOS transistors, and a pair of NMOS transistors. The switch circuit may include MOSFET switch transistors. The MOSFET switch transistors may include NMOS transistors. The oscillator circuit, isolation transformer, rectifier and switch circuit may be all on an integrated circuit chip. The integrated circuit chip may be a CMOS chip. The isolation transformer may be a micro-transformer. The rectifier may include Schottky diodes.

This invention also features a fully integrated solid state transformer isolated relay on a CMOS integrated chip including an oscillator circuit responsive to a control signal for generating an a.c. signal; a micro-transformer having a primary winding which forms a part of the tank circuit of the oscillator circuit and a secondary winding. A rectifier responsive to the a.c. signal from the oscillator circuit provides a d.c. drive signal. A switch circuit responsive to the drive signal opens and closes the relay.

This invention also features a multi-channel solid state relay including a plurality of relay channels on an integrated circuit chip, each channel including an oscillator circuit responsive to a control signal for generating an a.c. signal; an isolation transformer having a primary winding which forms a part of the tank circuit of the oscillator circuit and a secondary winding; a rectifier responsive to the a.c. signal from the oscillator circuit for providing a d.c. drive signal. A switch circuit responsive to the drive signal opens and closes the relay.

In a preferred embodiment the isolation transformer may be a micro-transformer.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Figure 1:
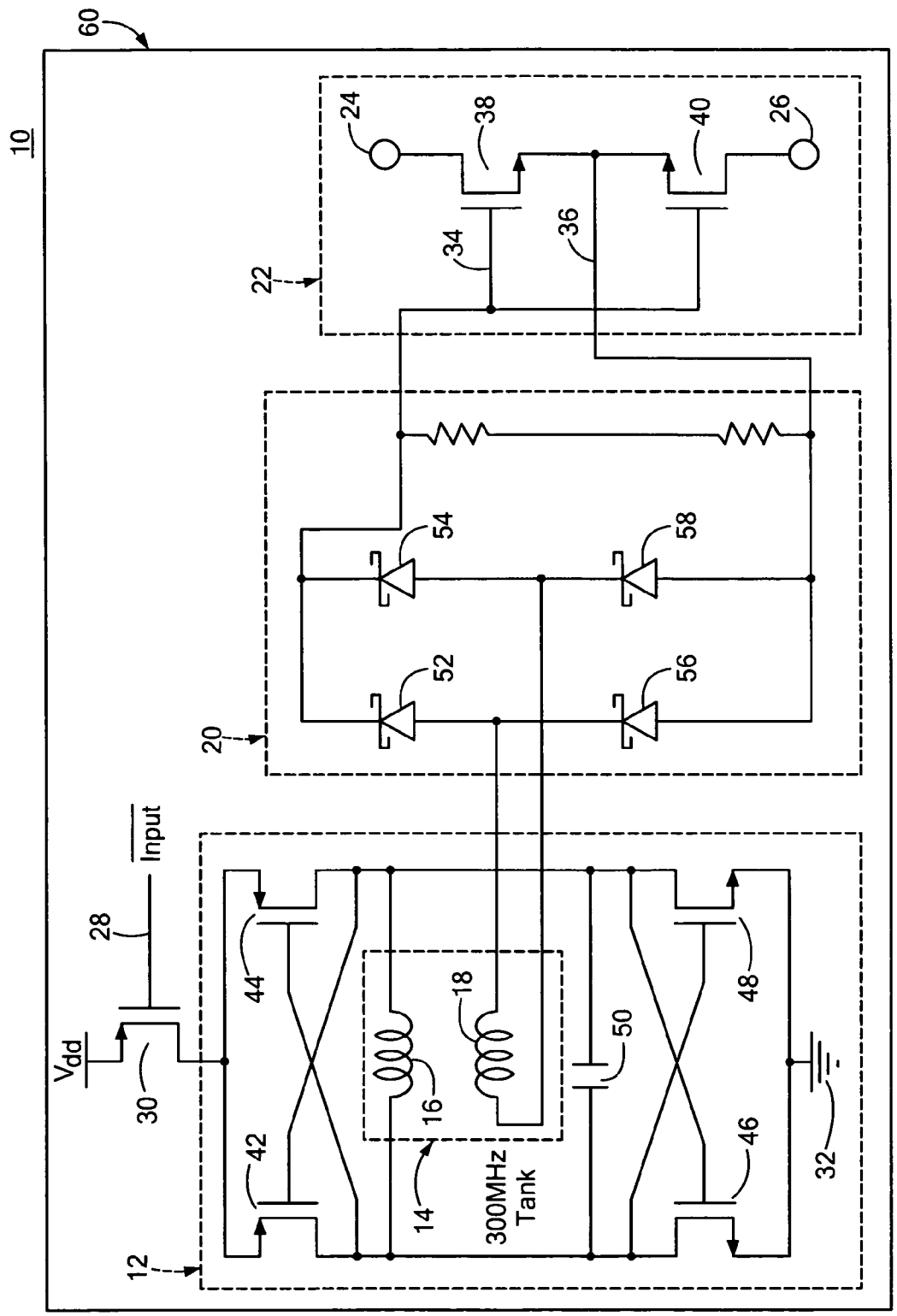
FIG. 1 is a simplified schematic diagram of a transformer-isolated solid state relay according to this invention.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

There is shown in FIG. 1 a solid state relay 10 with transformer isolation including oscillator 12, isolation transformer 14, which includes a primary 16 that actually forms a part of the tank circuit of oscillator 12, and the secondary 18 whose output is connected to rectifier 20. The d.c. output from rectifier 20 drives the relay switch circuit 22, which in turn drives a load through its load terminals 24 and 26. The input or control signal is delivered on line 28 to the gate of transistor 30 which has one end connected to the power supply $V_{dd}$ and the other to oscillator 12. The other end of oscillator 12 is grounded at 32. The input signal on line 28 is typically a digital signal that varies between a lower and a higher level.

In operation, when a control signal appears on line 28 transistor 30 closes or opens connecting or disconnecting $V_{dd}$ to oscillator 12. In this example, a high level would turn the relay on, a low level would turn it off. Oscillator 12 begins to oscillate providing a signal on primary winding 16. This is transferred to secondary winding 18 where the a.c. signal is rectified by rectifier 20. The rectified output is then used to drive the gates 34, 36 of transistor switches 38 and 40 in switch circuit 22 forming a bi-directional switch. Oscillator 12 is shown in the embodiment of FIG. 1, as a dual, cross-coupled, bi-stable oscillator having a first pair of transistor switches 42, 44 which are cross-coupled and a second pair 46 and 48 which are also cross-coupled. Oscillator 12 may generate an alternating current signal at 300 MHz where a primary 16 has an inductance of approximately 10 to 20 nanohenries and forms a part of the tank circuit of oscillator 12. The other part of the tank circuit is shown by capacitor 50 which may be in the order of approximately 10 picofarads. Actually that capacitance 50 is a representation of the parasitic capacitance associated with transistors 42, 44, 46, and 48. Rectifier 20 is shown as a full wave rectifier having four diodes 52, 54, 56, and 58 which may, for example, be Schottky diodes.

In a specific embodiment the transformer 14 may be a micro-transformer such as disclosed and defined in U.S. Pat. No. 7,075,329, entitled SIGNAL ISOLATORS USING MICRO-TRANSFORMERS, issued Jul. 11, 2006 hereby incorporated in its entirety by this reference.

In the specific embodiment the entire solid state relay 10 may be formed by CMOS fabrication. In that case transistors 38, 40, 42, 44, 46, and 48, would be CMOS FET's with transistors 38, 40, 46, and 48 being NMOS and transistors 42 and 44 being PMOS. And the diodes 52, 54, 56, and 58 may be Schottky diodes so that all of the components can be fabricated in the CMOS process and thus the entire solid state relay 10 may be fully integrated on a single integrated chip 60.

Figure 2:
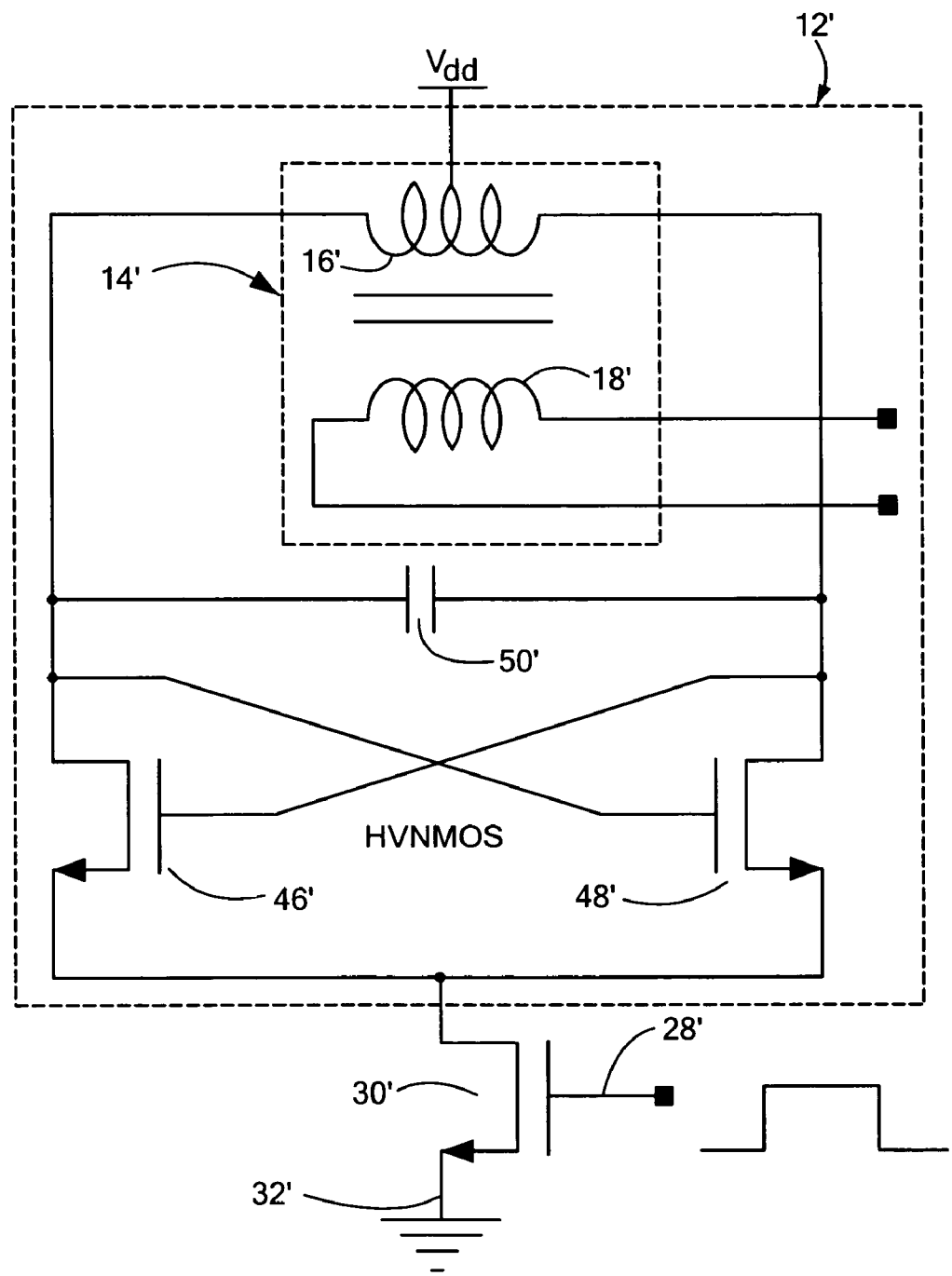
FIG. 2 is a simplified schematic diagram of another implementation of the oscillator of FIG. 1.

Oscillator 12 is not limited to the specific embodiment shown in FIG. 1; for example, a single cross-coupled, bi-stable oscillator 12', FIG. 2, could be used. Also in FIG. 2, $V_{dd}$ is connected directly to the primary 16' while the switch 28' is interconnected between the other end of oscillator 12' and ground 32'. The polarity of the transistors NMOS and PMOS may be swapped by simply swapping the sense of the applied voltage and current.

Figure 3:
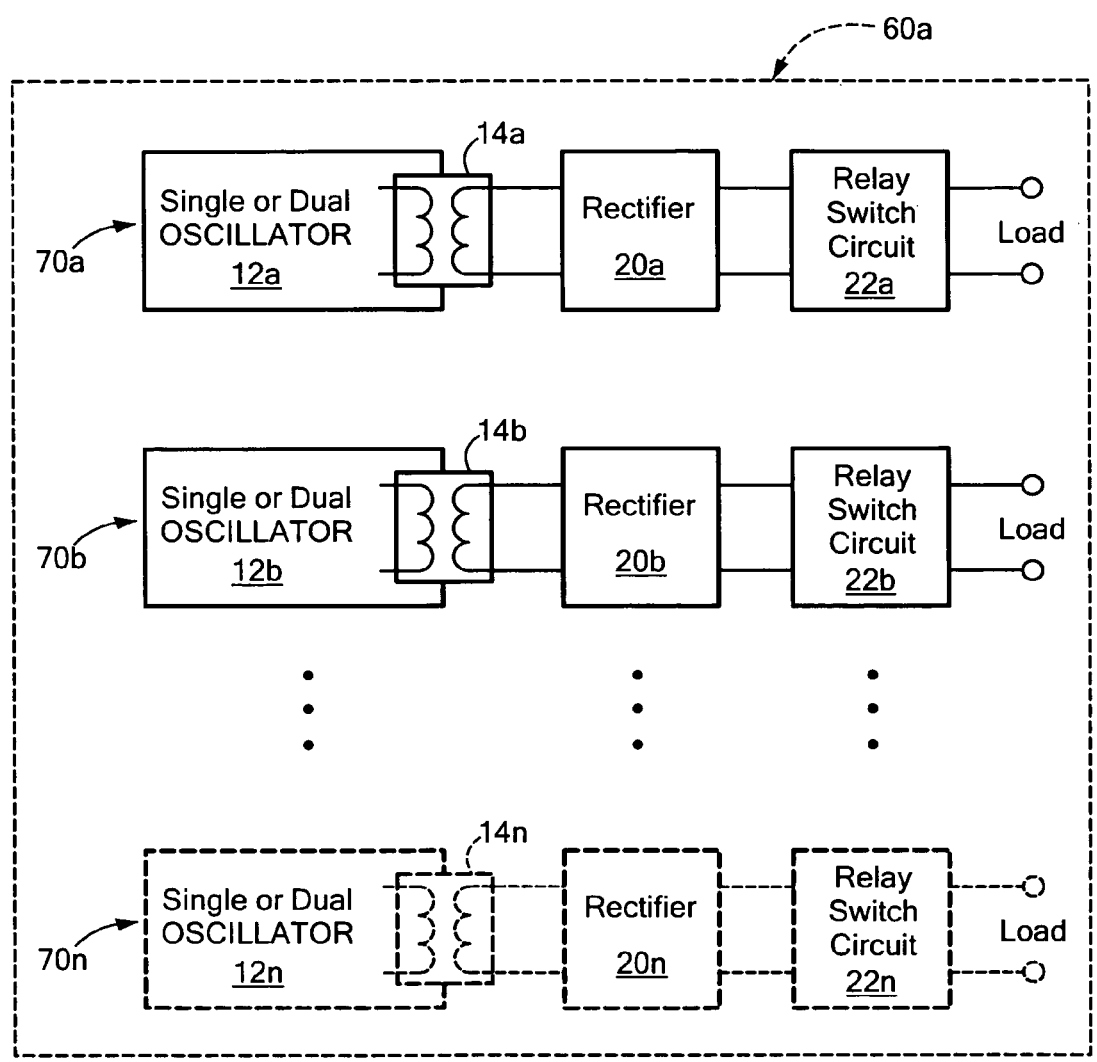
FIG. 3 is a simplified schematic block diagram of a multi-channel transformer-isolated solid state relay according to this invention.

The isolation without cross talk provided by the isolation transformer of this invention allows a number of channels 70a, 70b, 70n, FIG. 3, to be placed in close proximity or even on the same integrated circuit chip 60a to avoid fear of cross talk interference.

Figure 4:
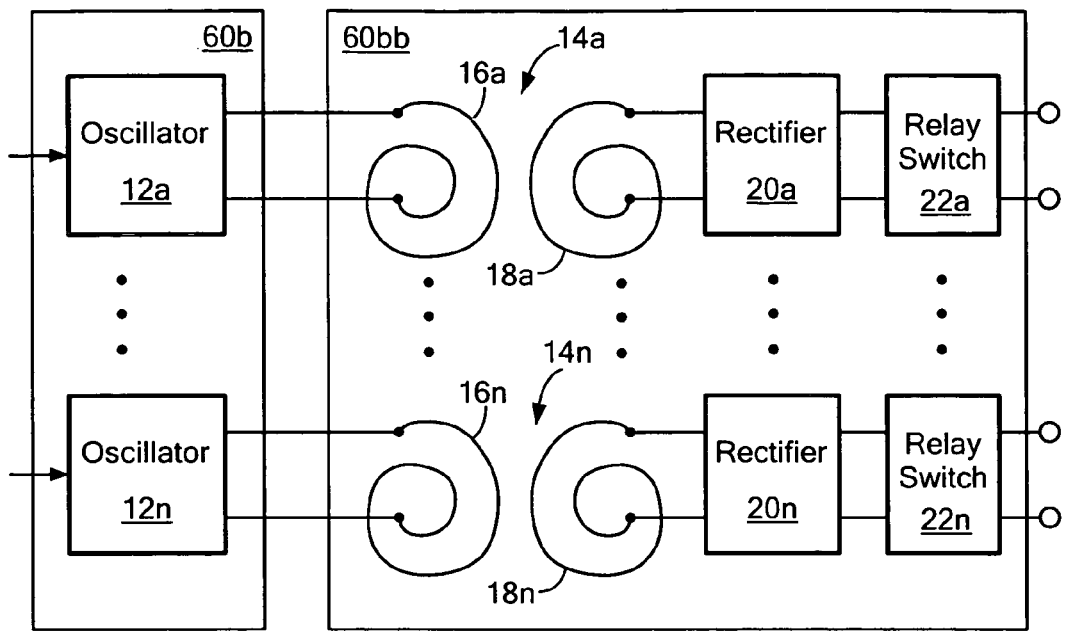
FIG. 4 is a simplified schematic block diagram of the relay of FIG. 1 on two integrated circuit chips with the oscillator(s) on its (their) own chip.
Figure 5:
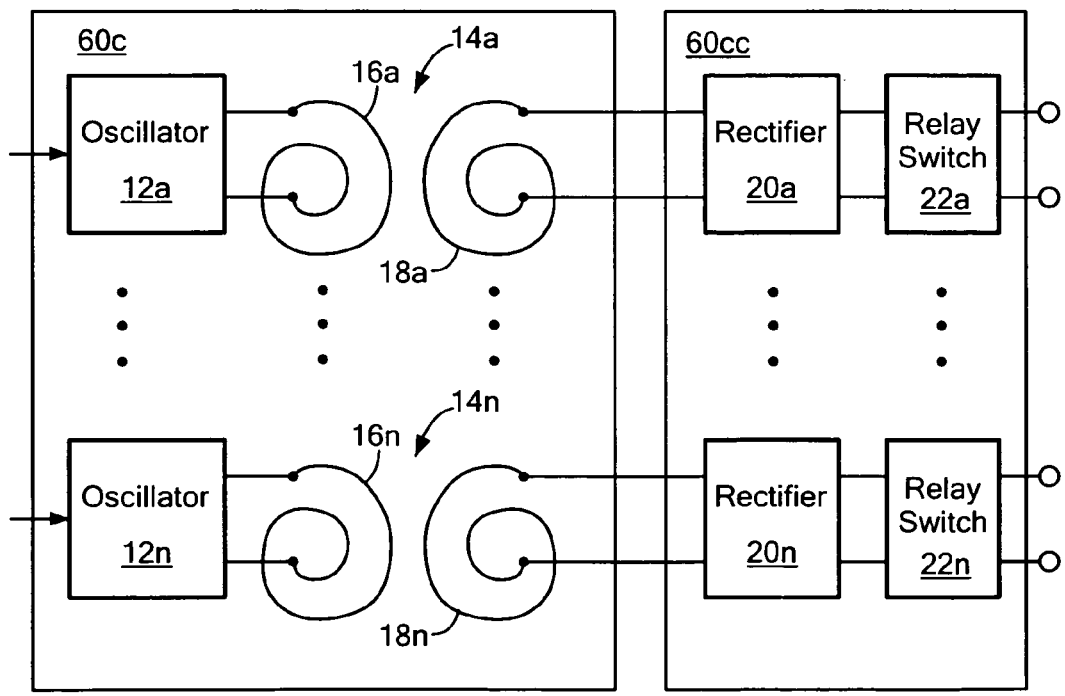
FIG. 5 is a simplified schematic block diagram of the relay of FIG. 1 on two integrated circuit chips with the oscillator(s) on its (their) own chip and transformers on their own chip.

Although thus far it has been represented that the solid state relay of this invention can beneficially, but not necessarily, be implemented on a single integrated circuit chip, and even more specifically the chip could be made by CMOS process, these are not limitations of the invention. For one example, FIG. 4, while the oscillators 12a-12n may be placed on one chip 60b, the transformers 14a-14n, rectifiers 20a-20n and relay switches 22a-22n may be placed on a second chip 60bb. Or, alternatively, FIG. 5, oscillators 12a-12n and transformers 14a-14n could be placed on one chip 60c while rectifiers 20a-20n and relay switches 22a-22n could be placed on a separate chip 60cc.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:
1. A solid state relay comprising:
an isolation transformer including a primary winding and a secondary winding;
an oscillator circuit responsive to an input signal for generating an a.c. signal, the oscillator circuit including the primary winding of the isolation transformer to form a part of a tank circuit of said oscillator circuit and consisting of a single cross-coupled, bi-stable oscillator;
a power supply transistor connected between the single cross-coupled, bi-stable oscillator and a ground terminal;
a rectifier responsive to said a.c. signal from said oscillator circuit for providing a d.c. drive signal; and
a switch circuit responsive to said drive signal opens to thereby drive a load at terminals of the switch circuit.

2. The solid state relay of claim 1, wherein operation of the tank circuit is influenced by a parasitic capacitance of said oscillator circuit and an inductance of the primary winding.

3. The solid state relay of claim 1 in which the rectifier is a full wave rectifier.

4. The solid state relay of claim 1 in which the switch circuit is a bi-directional switch.

5. The solid state relay of claim 1 in which the single cross-coupled, bi-stable oscillator is a single wave oscillator including a pair of MOSFET oscillator switches.

6. The solid state relay of claim 5 in which the pair of MOSFET oscillator switches are NMOS transistors.

7. The solid state relay of claim 1 in which said switch circuit includes MOSFET switch transistors.

8. The solid state relay of claim 7 in which the MOSFET switch transistors include NMOS transistors.

9. The solid state relay of claim 1, in which said oscillator circuit, the isolation transformer, the rectifier and switch circuit are all on an integrated circuit chip.

10. The solid state relay of claim 9, in which the integrated circuit chip is a CMOS chip.

11. The solid state relay of claim 1 in which said isolation transformer is a micro-transformer.

12. The solid state relay of claim 1 in which said rectifier includes Schottky diodes.

13. A fully integrated solid state transformer isolated relay on a CMOS integrated chip comprising:
a micro-transformer including a primary winding and a secondary winding;
an oscillator circuit responsive to an input signal for generating an a.c. signal, the oscillator circuit including the primary winding of the micro-transformer, which forms a part of a tank circuit of said oscillator circuit and consisting of a single cross-coupled, bi-stable oscillator, wherein the single cross-coupled, bi-stable oscillator comprises a pair of cross-coupled transistors having a source terminal connected to a first terminal of a power supply transistor, wherein a second terminal of the power supply transistor is connected to a ground terminal;
a rectifier responsive to said a.c. signal from said oscillator circuit for providing a d.c. drive signal; and
a switch circuit responsive to said drive signal opens to thereby drive a load at terminals of the switch circuit, wherein the oscillator circuit, the micro-transformer, the rectifier and the switch circuit are all on a CMOS integrated circuit chip.

14. The fully integrated solid state transformer isolated relay on a CMOS integrated chip of claim 13, wherein the power supply transistor is controlled by a control signal.

15. The fully integrated solid state transformer isolated relay of claim 14, wherein the control signal varies between a high value and a low value.

16. A multi-channel solid state relay comprising:
a plurality of relay channels on an integrated circuit chip, each channel including:
an isolation transformer including a primary winding and a secondary winding;
an oscillator circuit responsive to an input signal for generating an a.c. signal, the oscillator circuit including the primary winding of the isolation transformer, which forms a part of a tank circuit of said oscillator circuit and consisting of a single cross-coupled, bi-stable oscillator, wherein the single cross-coupled, bi-stable oscillator comprises a pair of cross-coupled transistors having a source terminal connected to a first terminal of a power supply transistor, wherein a second terminal of the power supply transistor is connected to a ground terminal;
a rectifier responsive to said a.c. signal from said oscillator circuit for providing a d.c. drive signal; and
a switch circuit responsive to said drive signal opens to thereby drive a load at terminals of the switch circuit;
wherein each relay channel is isolated from cross talk interference from the other relay channels by the respective isolation transformer in each of the plurality of relay channels.

17. The multi-channel solid state relay of claim 16 in which said isolation transformer is a micro-transformer.

18. The solid state relay of claim 1, further comprising a switch having a terminal connected to the oscillator and a terminal connected to an input signal source, wherein the switch is controlled by a control signal.

19. The solid state relay of claim 18, wherein the control signal varies between a high value and a low value.

20. The multi-channel solid state relay of claim 16, further comprising a switch having a terminal connected to the oscillator and a terminal connected to an input signal source, wherein the switch is controlled by a control signal.

21. The multi-channel solid state relay of claim 20, wherein the input signal source is a power supply voltage.

22. The multi-channel solid state relay of claim 20, wherein the control signal varies between a high value and a low value.

23. The multi-channel solid state relay of claim 16, wherein the oscillator circuit comprises a dual, cross-coupled, bi-stable oscillator that includes a pair of PMOS transistors, and a pair of NMOS transistors.

* * * * *